United States Patent
Sahu

(10) Patent No.: US 6,377,102 B2
(45) Date of Patent: Apr. 23, 2002

(54) LOAD EQUALIZATION IN DIGITAL DELAY INTERPOLATORS

(75) Inventor: Debapriya Sahu, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/755,806

(22) Filed: Jan. 5, 2001

Related U.S. Application Data

(60) Provisional application No. 60/185,784, filed on Feb. 29, 2000.

(51) Int. Cl.[7] .............................................. H03H 11/26
(52) U.S. Cl. ...................... 327/276; 327/278; 327/294; 327/400
(58) Field of Search .................................. 327/136, 166, 327/250, 261, 264, 270–272, 276–278, 284, 285, 291, 294, 298, 407, 408, 394–396, 398–401

(56) References Cited

U.S. PATENT DOCUMENTS

| | | | | |
|---|---|---|---|---|
| 4,899,071 A | * | 2/1990 | Morales ....................... | 327/277 |
| 5,039,893 A | * | 8/1991 | Tomisawa ................... | 327/276 |
| 5,227,679 A | * | 7/1993 | Woo ............................. | 326/50 |
| 5,453,709 A | * | 9/1995 | Tanimoto et al. ........... | 327/276 |
| 5,489,864 A | * | 2/1996 | Ashuri ........................ | 327/161 |
| 5,668,192 A | * | 9/1997 | Pedersen et al. ............ | 327/291 |
| 5,694,377 A | * | 12/1997 | Kushnick .................... | 368/120 |
| 5,748,125 A | * | 5/1998 | Cederbaum et al. ........ | 341/136 |
| 5,898,242 A | * | 4/1999 | Peterson ..................... | 327/278 |
| 5,917,762 A | * | 6/1999 | Zheng et al. ................ | 365/194 |
| 6,023,181 A | * | 2/2000 | Penny et al. ................ | 327/291 |
| 6,163,195 A | * | 12/2000 | Jefferson .................... | 327/262 |

\* cited by examiner

*Primary Examiner*—Kenneth B. Wells
*Assistant Examiner*—Hai L. Nguyen
(74) *Attorney, Agent, or Firm*—J. Dennis Moore; W. James Brady, III; Frederick J. Telecky, Jr.

(57) ABSTRACT

A digital delay interpolator adapted to receive a first clock signal and a second clock signal, the second clock signal having a transition at a time that is delayed with respect to the time of a transition of the first clock signal, and to provide an output clock signal having a transition at a time intermediate the time of the transition of the first clock signal and the time of the transition of the second clock signal. The interpolator includes a first plurality of selectively enabled delay circuits and a second plurality of selectively enabled delay circuits, the first plurality of delay circuits having an input port being adapted to receive the first clock signal, and the second plurality of delay circuits having an input port being adapted to receive the second clock signal. The first plurality of delay circuits and the second plurality of delay circuits have outputs connected together to form the output of the digital delay interpolator. Each of the delay circuits includes a first delay buffer element adapted to receive one of the first and second clock signals, and being enabled by an enable signal, a second delay buffer element connected to the output of the first delay buffer, and being enabled by the enable signal, and circuit means for providing a predetermined voltage at the common connection point of the first delay buffer and the second delay buffer when the first and second delay buffers are not enabled.

6 Claims, 2 Drawing Sheets

LOAD EQUALIZATION IN DIGITAL DELAY INTERPOLATORS

This application claims priority under 35 U.S.C. §119 (e)(1) of provisional application No. 60/185,784 filed Feb. 29, 2000.

TECHNICAL FIELD OF THE INVENTION

This invention relates to tristatable circuit elements. More particularly, the present invention relates to digital delay interpolators, specifically, to an apparatus for generating uniform delays in digital delay interpolators.

BACKGROUND OF THE INVENTION

Weighted interpolation of digital delay taps is a known technique for subdividing the delay into finer delays for better resolution, for example in delay locked loops. FIG. 1 shows a typical prior art delay chain 10, which may, for example, be part of a ring oscillator. The delay chain 10 is made of four delay elements 12, 14, 16, 18 connected in series, as shown. An input signal IN is applied to the input of the first delay element 12, and it is passed down the chain 10. Each element in the chain 10 gives the input signal a delay of T. Thus, the signal at the output of delay element 12 has a delay of T with respect to signal IN, the signal at the output of delay element 14 has a delay of 2T with respect to signal IN, the signal at the output of delay element 16 has a delay of 3T with respect to signal IN, and the signal at the output of delay element 18 has a delay of 4T with respect to signal IN.

FIG. 2 shows a typical prior art digital delay interpolator 20. The interpolator 20 is made of two groups of delay elements, in this case each being an inverter. The first group, on the left of the figure, is comprised of four delay elements i1L, i2L, i3L and i4L, of equal strength, each having its input connected to receive a signal L on line 22, while the second group is comprised of four delay elements i1R, i2R, i3R and i4R, of equal strength, each having its input connected to receive a signal R on line 24. Each delay element receives a respective differential pair of enable signals Delay elements i1L and i1R receive enable signals EN1 and $\overline{EN1}$, delay elements i2L and i2R receive enable signals EN2 and $\overline{EN2}$, delay elements i3L and i3R receive enable signals EN3 and $\overline{EN3}$, while delay elements i4L and i4R receive enable signals EN4 and $\overline{EN4}$. The signals L and R may be, for example, the outputs of two adjacent delay elements of the delay chain 10 of FIG. 1, such as delay element 12 and delay element 14 for example. In this discussion it is assumed that signal R is delayed more than signal L.

Delay interpolator 20 functions to cause the timing of its output signal OUT to be controlled incrementally more or less by the timing of signal L or signal R, depending on which of its delay elements are selected for enablement, i.e., their associated enable signal is ON. Thus, the delay through interpolator 20 may be subdivided into, for example four T/4 delays and thereby provide a finer gradation of delay when used with, for example, the delay chain 10 of FIG. 1. The delay elements in the interpolator 20 are tristatable inverters and at any given time four out of the eight inverters are ON, i.e., enabled. Minimum delay is achieved when all four inverters receiving the L signal (i1L, i2L, i3L and i4L) are ON. The next greater delay is achieved when three inverters receiving L and one inverter receiving R are ON. The next greater delay is achieved when two inverters receiving L and two inverters receiving R are ON. The next greater delay is achieved when one inverter receiving L and three inverters receiving R are ON. Maximum delay is achieved when all four inverters receiving the R signal (i1R, i2R, i3R and i4R) are ON.

Now, assume that interpolation is to be between a delay of 2T and 3T by selecting the signal from FIG. 1 delayed by 2T, i.e., the output of delay element 14, to be signal L and by selecting the signal from FIG. 1 delayed by 3T, i.e., the output of delay element 16, to be signal R. Assume that the inherent delay due to any four of the tristatable inverters driving the output is t. When all of the L delay elements, i1L, i2L, i3L and i4L, are ON (the rest are OFF) the delay through interpolator 20 is equal to 2T+0+t. When delay elements i1R, i2L, i3L and i4L, are ON the delay through interpolator 20 is equal to 2T+T/4+t. When delay elements i1R, i2R, i3L and i4L, are ON the delay through interpolator 20 is equal to 2T+2T/4+t. Likewise, when delay elements i1R, i2R, i3R and i4L, are ON the delay through interpolator 20 is equal to 2T+4T/4+t, or, 3T+t.

However, the delays expressed above are theoretical delays. In reality, these delays are significantly shorter than expressed above, and these delays vary depending upon the delay selected. This is because of parasitic capacitances in the tristatable inverters, giving rise to capacitance at the interpolated output OUT, and because the capacitive load at output OUT is not the same in all cases.

The capacitance at the output of any given tristatable inverter in interpolator 20 depends on the voltage at its input, even when it is in the OFF state. FIG. 3 is a circuit diagram of one of these inverters, each of which has the same construction. As can be seen, the capacitance at the output of the inverter is the sum of the gate to drain capacitances of the PMOS transistor 30 and NMOS transistor 32, i.e., $C_{gdp}$ and $C_{gdn}$, respectively, and of the back gate to drain capacitances of PMOS transistor 30 and NMOS transistor 32, i.e., $C_{bdp}$ and $C_{bdn}$, respectively. Normally, if the input signal IN is HIGH the values for $C_{gdn}$ and $C_{bdn}$ are also high, while if IN is low the values for $C_{gdp}$ and $C_{bdp}$ are high, resulting in a relatively high capacitive load at the output of this circuit in such cases. However, if IN is somewhere near mid-supply the capacitive contributions from both PMOS transistor 30 and NMOS transistor 32 are almost equal and the total capacitance is low. Consequently, the capacitive load at the output of this circuit is small in this case. An additional effect is that any rising or falling transition of the input signal IN is coupled to the output through $C_{gdp}$ and $C_{gdn}$, and affects the output.

Because of these effects, the interpolated delays vary from the ideal magnitude expressed above. FIGS. 4(A) and 4(B) will now be referred to, to explain this further. These figures are signal diagrams in which the horizontal axis represents time and the vertical axis represents voltage. In both figures ten signals appearing at the output of the interpolator 20 of FIG. 2 are superimposed, each such signal having successively greater delay, as shown by transitions 34, 36, 38, 40, 42, etc. It is assumed that, initially, the signal L is the output of delay element 14, while signal R is the output of delay element 16, accounting for the first five transitions, and that after the fifth transition the signal L is the output of delay element 16, while signal R is the output of delay element 18, accounting for the next five transitions.

Consider transition 34 in FIG. 4. A transition delayed by tristate inverters i1L, i2L, i3L and i4L, has this delay. During this transition, signal R is HIGH, and therefore the capacitive load due to tristate inverters i1R, i2R, i3R and i4R, is maximum. The corresponding delay through interpolator 20 is, likewise, maximum.

However, consider transition 42. A transition delayed by tristate inverters i1R, i2R, i3R and i4R, has this delay. During this transition, signal L is completing a transition, and hence the effective capacitive load offered by tristate inverters i1L, i2L, i3L and i4L, is much less than the load in the capacitive load in the previous case. The corresponding delay through interpolator 20 is, likewise, minimum. For intermediate transitions 36, 38 and 40, the same considerations apply, with decreasing load capacitance, and correspondingly decreasing delay, respectively. This creates a "dead zone" in the delay interpolation by compressing the delays as the transitions are decreasingly delayed. This dead zone is seen where the changeover occurs to the next pair of coarse delay signals, e.g., between transition 42 and transition 44. Therefore, it can be seen that this approach becomes unusable where regularly spaced transitions are desired, for example in delay locked loops where a very clean clock, having low jitter, is desired.

SUMMARY OF THE INVENTION

The present invention provides an improved digital delay interpolator having uniformly spaced delays. In accordance with the present invention there is provided a digital delay interpolator adapted to receive a first clock signal and a second clock signal, the second clock signal having a transition at a time that is delayed with respect to the time of a transition of the first clock signal, and to provide an output clock signal having a transition at a time intermediate the time of the transition of the first clock signal and the time of the transition of the second clock signal. The interpolator includes a first plurality of selectively enabled delay circuits and a second plurality of selectively enabled delay circuits, the first plurality of delay circuits having an input port being adapted to receive the first clock signal, and the second plurality of delay circuits having an input port being adapted to receive the second clock signal. The first plurality of delay circuits and the second plurality of delay circuits have outputs connected together to form the output of the digital delay interpolator. Each of the delay circuits includes a first delay buffer element adapted to receive one of the first and second clock signals, and being enabled by an enable signal, a second delay buffer element connected to the output of the first delay buffer, and being enabled by the enable signal, and circuit means for providing a predetermined voltage at the common connection point of the first delay buffer and the second delay buffer when the first and second delay buffers are not enabled.

According to another aspect of the invention there is provided a tristatable element circuit being powered by a power supply connected to a ground connection and having a supply voltage. Included are a first tristatable circuit element having an input port, an output port and a tristate control port, and a second tristatable circuit element having an input port connected to the output port of the first tristatable circuit element, an output port and a tristate control port. Also provided is a switch coupled between the common connection node of the output of the first tristatable circuit element and the input of the second tristatable circuit element and a voltage source having a magnitude intermediate the supply voltage and ground, and being adapted to be switched to an ON state when the enable signal is OFF.

These and other features of the invention will be apparent to those skilled in the art from the following detailed description of the invention, taken together with the accompanying drawings.

DETAILED DESCRIPTION OF THE PREFERRED EMBODIMENTS

Figure 2:
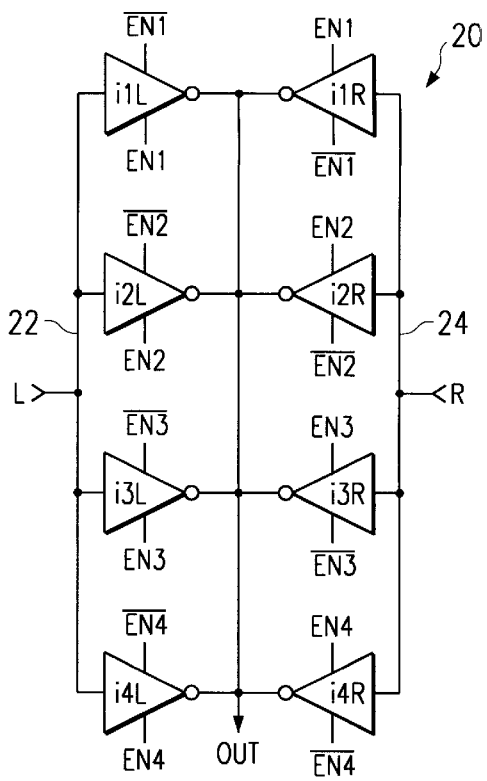
FIG. 2 is a diagram of a prior art digital delay interpolator.
Figure 3:
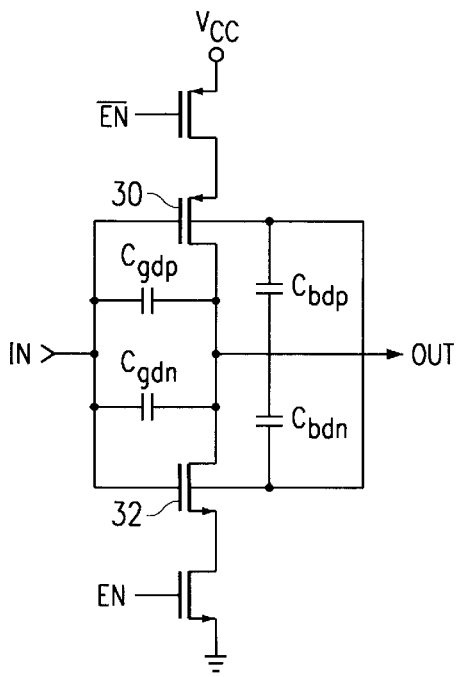
FIG. 3 is a circuit diagram of a delay element of the interpolator of FIG. 2.
Figure 5:
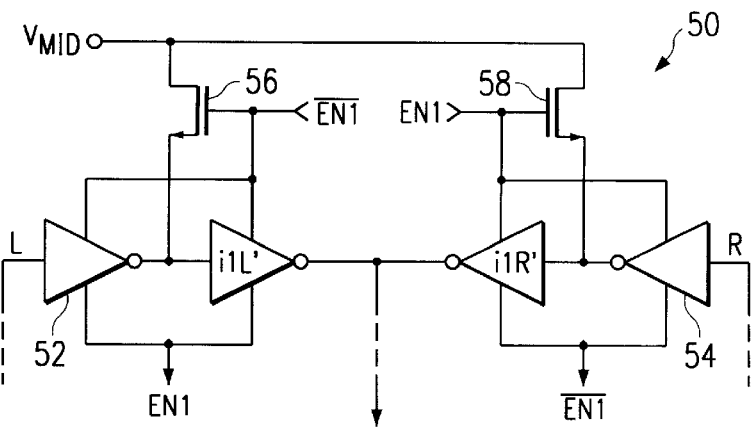
FIG. 5 is a diagram of a pertinent portion of the preferred embodiment of the present invention.
Figure 6:
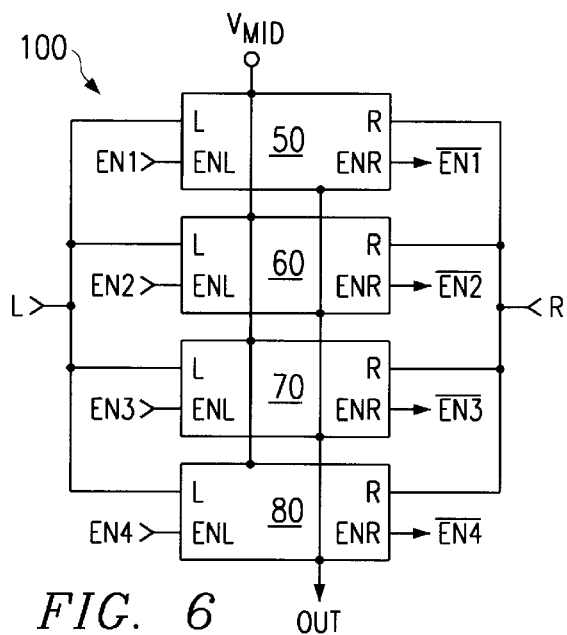
FIG. 6 is a diagram showing, in conjunction with FIG. 5, the preferred embodiment of the present invention.

A digital delay interpolator of a preferred embodiment of the present invention is shown in FIGS. 5 and 6. In this embodiment another tristate inverter is used to drive each of the previously described tristate inverters in a delay circuit. FIG. 5 shows one "pair" 50 of such delay circuits, corresponding, to inverters i1L and i1R of FIG. 2. It will be understood that other pairs of delay elements like those in FIG. 5 are also part of this embodiment, interconnected in similar fashion as the tristate inverter pairs of FIG. 2, as shown in FIG. 6, wherein the three other pairs of delay circuits 60, 70 and 80 are shown, all constituting the digital delay interpolator 100 of this embodiment. It will also be understood that each of the other such pairs of delay circuits 60, 70 and 80. are of the same construction as that of delay circuit pair 50.

Turning now to FIG. 5, the main tristate inverter i1L' (corresponding to tristate inverter i1L of FIG. 2), the output of which contributes to the output of the interpolator of which it is a part, is now driven by another tristate inverter 52, the input of which receives signal L. Likewise, tristate inverter i1R', the output of which contributes to the output OUT of the interpolator of which it is a part, is now driven by another tristate inverter 54, the input of which receives signal R. Both of the "left" inverters 52 and i1L' receive differential enable signals EN1 and $\overline{EN1}$ at their inverting tristate control input, and non-inverting tristate control input, respectively. Likewise, both of the "right" inverters 54 and i1R' receive differential enable signals $\overline{EN1}$ and EN1 at their inverting tristate control input, and non-inverting tristate control input, respectively. The signal $\overline{EN1}$ is also connected to the gate of an NMOS transistor 56, the source of which is connected to the output of inverter 52, which is also connected to the input of inverter i1L'. The drain of transistor 56 is connected to a reference voltage $V_{MID}$ which is near the middle of the level of the supply voltage. Likewise, the signal EN1 is also connected to the gate of an NMOS transistor 58, the source of which is connected to the output of inverter 54, which is also connected to the input of inverter i1R'. The drain of transistor 58 is connected to reference voltage $V_{MID}$.

The NMOS transistors 56 and 58 function as switches, ensuring that the effective capacitance at the output of the associated inverter i1L' and i1R', respectively, that is disabled is always the same, and is independent of whether the inverter belongs to side L or side R. This maintains a constant and optimized capacitive load, due to the inverters that are in an OFF state, at the output OUT of the interpolator, independent of delay combinations. Rather than use a CMOS switch configuration, an NMOS switch is used in this embodiment in order to reduce the capacitance offered by the switch to the tristate inverter (e.g., 52) which drives the final tristate inverter (e.g., i1L'). Since an NMOS switch, and not a complete CMOS switch, is used, the $V_{MID}$ reference voltage has been kept lower than mid-supply, to reduce the resistance offered by the NMOS switch, and thereby increase the switching speed.

Figure 1:
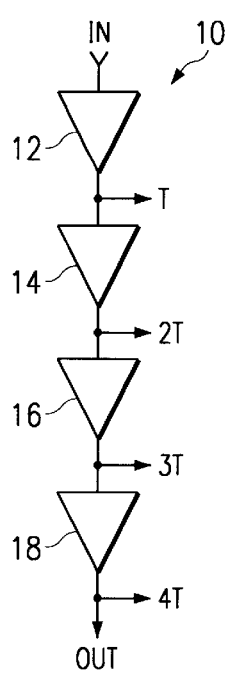
FIG. 1 is a diagram of a prior art delay chain.
Figure 4:
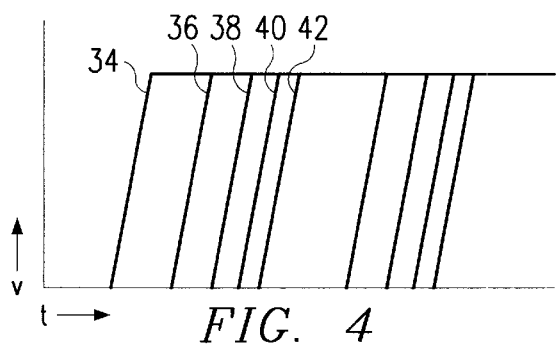
FIG. 4 is a signal timing diagram showing a number of output signals of the interpolator of FIG. 2, having differing delays.
Figure 7:
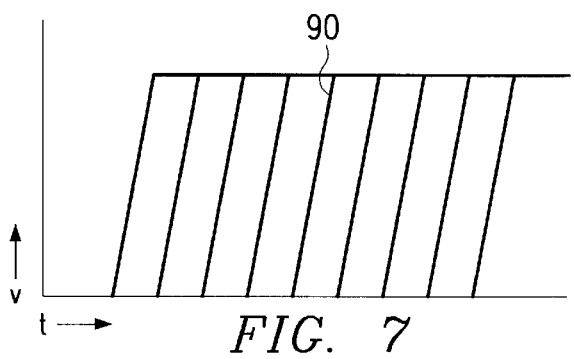
FIG. 7 is a signal timing diagram like that of FIG. 4, but showing a number of output signals of the interpolator of FIGS. 5 and 6.

The result of this new inventive configuration is the distribution of the subdivision delays of the coarse range T delays uniformly, as shown in FIG. 7, which is a diagram like FIG. 4, but showing the same signals appearing at the output of an interpolator constructed as in FIG. 5. Note that the transitions between the fifth and sixth delayed output signals overlap at 90, as should be the case, and no dead zone is present. The fifth transition is the result of inverters i1R, i2R, i3R and i4R, switching, with coarse range signals having delay 2T and 3T (i.e., the outputs of inverters 14 and 16 of FIG. 1, respectively) being the signals L and R, respectively. The sixth transition is the result of inverters i1L, i2L, i3L and i4L, switching, with coarse range signals having delay 3T and 4T (i.e., the outputs of inverters 16 and 18 of FIG. 1, respectively) being the signals L and R, respectively. Note that the use of $V_{MID}$ to the inverter input does not affect the high current state of the inverter, since the $V_{MID}$ voltage is applied to an inverter only when it is disabled, but not when it is enabled.

Figure 8:
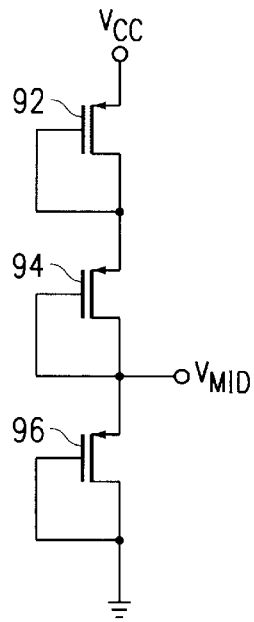
FIG. 8 is a diagram of a circuit that may be used to generate an intermediate voltage used in the interpolator of FIGS. 5 and 6.

The $V_{MID}$ voltage may be generated using the MOS-diode chain shown in FIG. 8, comprising three PMOS transistors 92, 94 and 96, configured as diodes by having their gates and drains connected together, and connected in series between the supply voltage VCC and ground, as shown. The voltage $V_{MID}$ is taken from the common connection point of the drain of transistor 94 and the source of transistor 96, the gate and drain of transistor 96 being connected to ground.

The preferred embodiment may be used in clock synthesis and other applications in which a high performance digital interpolator is desired.

Although the present invention and its advantages have been described in detail, it should be understood that various changes, substitutions and alterations can be made herein without departing from the spirit and scope of the invention as defined by the appended claims. For example, although the preferred embodiment has been described in the context of a four stage delay to produce four subdivided delays, the invention is not so limited. Any number of subdivisions may be provided. In addition, other circuits and methods may be used to generate the mid-range voltage $V_{MID}$ than those described above. Further, while tristate inverters are used as delay elements in the preferred embodiment, other tristate delay elements may be used, as well. All such variations and embodiments are considered within the scope of the invention, which should be limited only by the language of the claims appended hereto.

What is claimed is:

1. A digital delay interpolator adapted to receive a first clock signal and a second clock signal, said second clock signal having a transition at a time that is delayed with respect to the time of a transition of said first clock signal, and to provide an output clock signal having a transition at a time intermediate the time of said transition of said first clock signal and the time of said transition of said second clock signal, comprising:

a first plurality of selectively enabled delay circuits and a second plurality of selectively enabled delay circuits, said first plurality of delay circuits having an input port being adapted to receive said first clock signal, and said second plurality of delay circuits having an input port being adapted to receive said second clock signal, said first plurality of delay circuits and said second plurality of delay circuits having outputs connected together to form the output of said digital delay interpolator, each of said delay circuits comprising a first delay buffer element adapted to receive one of said first and second clock signals, and being enabled by an enable signal, a second delay buffer element connected to the output of said first delay buffer, and being enabled by said enable signal, and circuit means for providing a predetermined voltage at the common connection point of said first delay buffer and said second delay buffer when said first and second delay buffers are not enabled.

2. A digital delay interpolator adapted to receive a first clock signal and a second clock signal, said second clock signal having a transition at a time that is delayed with respect to the time of a transition of said first clock signal, and to provide an output clock signal having a transition at a time intermediate the time of said transition of said first clock signal and the time of said transition of said second clock signal, comprising:

a first plurality of selectively enabled delay circuits and a second plurality of selectively enabled delay circuits, said first plurality of delay circuits having an input port being adapted to receive said first clock signal, and said second plurality of delay circuits having an input port being adapted to receive said second clock signal, said first plurality of delay circuits and said second plurality of delay circuits having outputs connected together to form the output of said digital delay interpolator, each of said delay circuits being powered by a power supply having a pair of terminals and comprising a first selectively enabled delay element having an input port being adapted to receive said first clock signal, having an output port, and having an enable port for receiving an enable signal to enable said first delay element when ON, a second selectively enabled delay element having an input port connected to said output port of said first delay element, having an output port connected to said output of said interpolator, and having an enable port for receiving said enable signal to enable said second delay element when ON, a switch coupled between the common connection node of the output of said first delay element and the input of said second delay element and a voltage source having a magnitude intermediate the voltage level between said pair of terminals, and being adapted to be switched to an ON state when said enable signal is OFF.

3. A digital delay interpolator according to claim 2, wherein each of said selectively enabled delay elements is a tristate inverter.

4. A digital delay interpolator according to claim 2, wherein said switch is a MOS transistor, having a gate adapted to receive a signal inverse to said enable signal, and being connected between the common connection node of the output of said first delay element and the input of said second delay element and said intermediate magnitude voltage source by way of a drain and a source.

5. A tristatable element circuit being powered by a power supply connected to a ground connection and having a supply voltage, comprising:

a first tristatable circuit element having an input port, an output port and a tristate control port;

a second tristatable circuit element having an input port connected to the output port of said first tristatable circuit element, an output port and a tristate control port; and a switch coupled between the common connection node of the output of said first tristatable circuit element and the input of said second tristatable circuit element and a voltage source having a magnitude intermediate said supply voltage and ground, and being adapted to be switched to an ON state when said enable signal is OFF.

6. A tristatable element circuit according to claim 5, wherein said tristatable circuit elements are tristatable inverters.

* * * * *